US012666722B2

(12) United States Patent
Yuan et al.

(10) Patent No.: US 12,666,722 B2
(45) Date of Patent: Jun. 23, 2026

(54) DISPLAY PANEL

(71) Applicants: HUIZHOU CHINA STAR OPTOELECTRONICS DISPLAY CO., LTD., Huizhou (CN); TCL CHINA STAR OPTOELECTRONICS TECHNOLOGY CO., LTD., Shenzhen (CN)

(72) Inventors: Kaixuan Yuan, Huizhou (CN); Mengmeng Hu, Huizhou (CN); Chenchen Wu, Huizhou (CN); Zhensong Lin, Huizhou (CN)

(73) Assignees: HUIZHOU CHINA STAR OPTOELECTRONICS DISPLAY CO., LTD., Huizhou (CN); TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 378 days.

(21) Appl. No.: 18/569,230

(22) PCT Filed: Oct. 16, 2023

(86) PCT No.: PCT/CN2023/124746
§ 371 (c)(1),
(2) Date: Dec. 12, 2023

(87) PCT Pub. No.: WO2024/198305
PCT Pub. Date: Oct. 3, 2024

(65) Prior Publication Data
US 2025/0089369 A1       Mar. 13, 2025

(30) Foreign Application Priority Data

Mar. 28, 2023    (CN) .......................... 202310370727.8

(51) Int. Cl.
H10D 86/60       (2025.01)
H10D 86/40       (2025.01)

(52) U.S. Cl.
CPC ........... H10D 86/60 (2025.01); H10D 86/441 (2025.01)

(58) Field of Classification Search
CPC ................. H10D 86/60; H10D 86/441; G09G 2310/0264
See application file for complete search history.

(56) References Cited

U.S. PATENT DOCUMENTS 11,250,778 B2 * 2/2022 Lin ........................ G09G 3/325
2013/0141658 A1 * 6/2013 Lv ..................... G02F 1/136286
                                                    349/43

(Continued)

FOREIGN PATENT DOCUMENTS

CN       105652544 A       6/2016
CN       111583849 A       8/2020

(Continued)

OTHER PUBLICATIONS

International Search Report in International application No. PCT/CN2023/124746, mailed on Feb. 6, 2024.

(Continued)

*Primary Examiner* — Changhyun Yi
(74) *Attorney, Agent, or Firm* — PV IP PC; Wei Te Chung

(57) ABSTRACT

A display panel is provided. Each driver group corresponds to one flip-chip film. In one driver group, gate driver circuit arrangement groups and data line arrangement groups are alternately arranged. A number of GOA units included in each gate driver circuit arrangement group is greater than 0 and less than or equal to 2, a number of data lines included in each data line arrangement group is greater than 0 and less (Continued)

than or equal to 3, and a difference in the number of the data lines of any two data line arrangement groups is less than or equal to 1.

20 Claims, 3 Drawing Sheets

(56) References Cited

U.S. PATENT DOCUMENTS

| | | |
|---|---|---|
| 2022/0013056 A1 | 1/2022 | Wang et al. |
| 2022/0109006 A1 | 4/2022 | Guo et al. |
| 2022/0114933 A1 | 4/2022 | Zhu et al. |
| 2025/0130471 A1* | 4/2025 | Zhang ................. G09G 3/3674 |

FOREIGN PATENT DOCUMENTS

| | | |
|---|---|---|
| CN | 111798755 A | 10/2020 |
| CN | 113448129 A | 9/2021 |

OTHER PUBLICATIONS

Written Opinion of the International Search Authority in International application No. PCT/CN2023/124746, mailed on Feb. 6, 2024.

* cited by examiner

DISPLAY PANEL

CROSS REFERENCE TO RELATED APPLICATIONS

This application is a US national phase application based upon an International Application No. PCT/CN2023/124746, filed on Oct. 16, 2023, which claims the priority of Chinese Patent Application No. 202310370727.8, entitled "DISPLAY PANEL", filed on Mar. 28, 2023, the disclosures of which are incorporated herein by reference in its entirety.

FIELD OF INVENTION

The present disclosure relates to a display field, specifically to a display panel.

BACKGROUND

With development of display technology, display panels have been widely used in people's lives, such as display screens of mobile phones, computers, televisions, and the like. With advancement of life and development of technology, people have higher requirements for display performance of display panels. Display screens with large sizes, high resolution, and ultra-narrow borders (UNBs) have become a market trend. In order to improve a narrow border of a display panel, technology has been developed to mount gate driver on array (GOA) units (gate driver circuit units) on a same side of a border as a source driver circuit (GOA in source). Because the GOA in source can be used to realize a spliceable display panel with extremely narrow borders on three sides, it has become a focus in display industry.

However, current display panels have a problem of uneven display due to uneven coupling capacitance between data lines and GOA units caused by inappropriate arrangement of the GOA units and the data lines.

SUMMARY

An embodiment of the present disclosure provides a display panel, which can solve a problem of uneven display due to uneven coupling capacitance between data lines and GOA units caused by inappropriate arrangement of the GOA units and the data lines in current display panels.

An embodiment of the present disclosure provides a display panel comprising a display area and a driver area arranged on a side of the display area, and further comprising at least one driver group arranged in the driver area. Each of the at least one driver group corresponds to one flip-chip film, and each of the at least one driver group comprises a plurality of gate driver circuit arrangement groups and a plurality of data line arrangement groups.

In each of the at least one driver group, the gate driver circuit arrangement groups and the data line arrangement groups are alternately arranged, a number of GOA units included in each of the gate driver circuit arrangement groups is greater than 0 and less than or equal to 2, a number of data lines included in each of the data line arrangement group is greater than 0 and less than or equal to 3, and a difference in the number of the data lines of any two of the data line arrangement groups is less than or equal to 1.

Optionally, in some embodiments of the present disclosure, in each of the at least one driver group, the number of the data lines included in each of the data line arrangement groups is greater than 1 and less than or equal to 3.

Optionally, in some embodiments of the present disclosure, in one driver group, the number of data lines included in each data line arrangement group is greater than 0 and less than or equal to 2.

Optionally, in some embodiments of the present disclosure, in each of the at least one driver group, the number of data lines included in each of the data line arrangement groups is greater than 0 and less than or equal to 2.

Optionally, in some embodiments of the present disclosure, in each of the at least one driver group, each of the gate driver circuit arrangement groups comprising different numbers of the GOA units are evenly arranged.

Optionally, in some embodiments of the present disclosure, in each of the at least one driver group, each of the data line arrangement groups comprising different numbers of the data lines are evenly arranged.

Optionally, in some embodiments of the present disclosure, each of the at least driver group comprises a plurality of driver repetitive units, and in each driver repetitive unit, a ratio of the number of the data lines to the number of the GOA units is any one of 8:3, 16:9, and 4:3.

Optionally, in some embodiments of the present disclosure, each flip-chip film corresponds to or is electrically connected to 960 data lines.

Optionally, in some embodiments of the present disclosure, resolution of the display panel is 3840*2160, and the display panel corresponds to 12 flip-chip films.

Optionally, in some embodiments of the present disclosure, resolution of the display panel is 7680*4320, and the display panel corresponds to 24 flip-chip films.

Optionally, in some embodiments of the present disclosure, the ratio of the number of the data lines and the number of the GOA units in each driver repetitive unit is 8:3.

In each driver repetitive unit, the data lines and the GOA units are arranged in the following order: 2 data lines, 1 GOA unit, 3 data lines, 1 GOA unit, 3 data lines, and 1 GOA unit.

Optionally, in some embodiments of the present disclosure, the display panel further comprises a plurality of scan lines. Each scan line is electrically connected to two GOA units, and each of the at least driver group includes 960 data lines and 360 GOA units.

Optionally, in some embodiments of the present disclosure, the ratio of the number of the data lines and the number of the GOA units in each driver repetitive unit is 16:9.

In each driver repetitive unit, the data lines and the GOA units are arranged in the following order: 3 data lines, 2 GOA units, 2 data lines, 1 GOA unit, 3 data lines, 2 GOA units, 2 data lines, 1 GOA unit, 3 data lines, 2 GOA units, 3 data lines, and 1 GOA unit.

Optionally, in some embodiments of the present disclosure, the display panel further comprises a plurality of scan lines. Each scan line is electrically connected to two GOA units, and each of the at least driver group includes 960 data lines and 360 GOA units.

Optionally, in some embodiments of the present disclosure, the ratio of the number of the data lines and the number of the GOA units in each driver repetitive unit is 4:3.

In each driver repetitive unit, the data lines and the GOA units are arranged in the following order: 2 data lines, 2 GOA units, 3 data lines, 2 GOA units, 3 data lines, and 2 GOA units.

Optionally, in some embodiments of the present disclosure, the display panel further includes a plurality of scan lines. Each scan line is electrically connected to two GOA units, and each of the at least driver group includes 960 data lines and 720 GOA units.

ADVANTAGEOUS EFFECT

The embodiment of the present disclosure is directed to a display panel, which includes a display area and a driver area arranged on a side of the display area. The display panel further comprises at least one driver group arranged in the driver area. Each driver group corresponds to one flip-chip film. Each driver group comprises a plurality of gate driver circuit arrangement groups and a plurality of data line arrangement groups. In one driver group, the gate driver circuit arrangement groups and the data line arrangement groups are alternately arranged, a number of GOA units included in each gate driver circuit arrangement group is greater than 0 and less than or equal to 2, a number of data lines included in each data line arrangement group is greater than 0 and less than or equal to 3, and a difference in the number of the data lines of any two data line arrangement groups is less than or equal to 1. In one driver group, the gate driver circuit arrangement groups and the data line arrangement groups are alternately arranged, the number of the GOA units included in each gate driver circuit arrangement group is greater than 0 and less than or equal to 2, the number of the data lines included in each data line arrangement group is greater than 0 and less than or equal to 3, and the difference in the number of the data lines of any two data line arrangement groups is less than or equal to 1, so that the data lines and the GOA units are evenly arranged. Even if the number of the data lines is not an integer multiple of the number of the GOA units, the data lines and the GOA units are arranged as evenly as possible, so that a coupling capacitance between the data lines and the GOA units is as uniform as possible, and thus capacitance loads of the data lines are as close to each other as possible, thereby preventing the display panel from display unevenness.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF THE EMBODIMENTS

To help a person skilled in the art better understand the solutions of the present disclosure, the following clearly and completely describes the technical solutions in the embodiments of the present disclosure with reference to the accompanying drawings in the embodiments of the present disclosure. Apparently, the described embodiments are a part rather than all of the embodiments of the present disclosure. All other embodiments obtained by a person of ordinary skill in the art based on the embodiments of the present disclosure without creative efforts shall fall within the protection scope of the present disclosure. In this application, unless otherwise specified, the directional words used such as "upper" and "lower" usually refer to the upper and lower positions of the device in actual use or working conditions. The term "inside" and "outside" refer to the outline of the device.

The embodiment of the present disclosure is directed to a display panel, which includes a display area and a driver area arranged on a side of the display area. The display panel further comprises at least one driver group arranged in the driver area. Each driver group corresponds to one flip-chip film. Each driver group comprises a plurality of gate driver circuit arrangement groups and a plurality of data line arrangement groups. In one driver group, the gate driver circuit arrangement groups and the data line arrangement groups are alternately arranged, a number of GOA units included in each gate driver circuit arrangement group is greater than 0 and less than or equal to 2, a number of data lines included in each data line arrangement group is greater than 0 and less than or equal to 3, and a difference in the number of the data lines of any two data line arrangement groups is less than or equal to 1. Each is explained in detail below. It should be noted that the order of description of the following embodiments does not limit the preferred order of the embodiments.

First Embodiment

Figure 1:
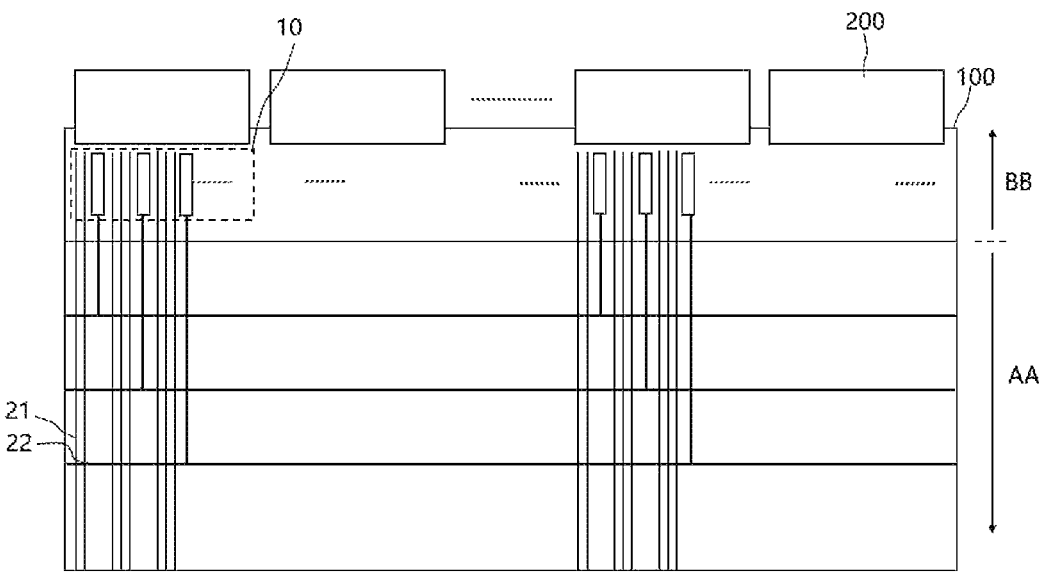
FIG. 1 is a schematic top view of a display panel according to a first embodiment and second embodiment of the present disclosure.
Figure 2:
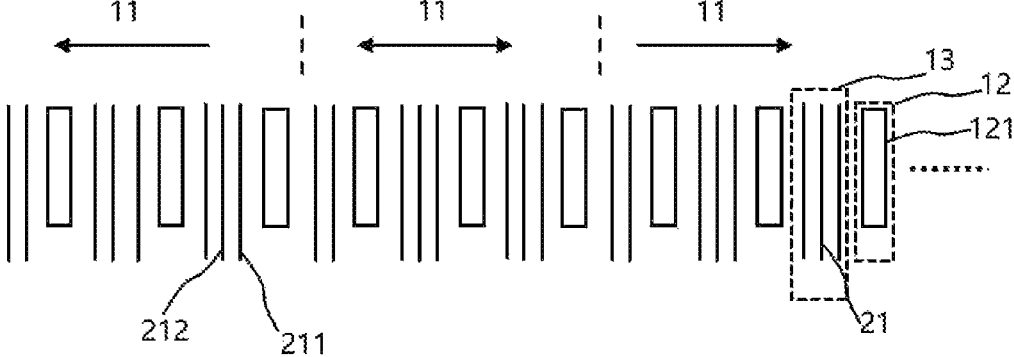
FIG. 2 is an enlarged schematic diagram of a driver group in FIG. 1.

Please refer to FIG. 1 and FIG. 2. FIG. 1 is a schematic top view of a display panel 100 provided in First Embodiment and Second Embodiment of the present disclosure. FIG. 2 is an enlarged schematic diagram of a driver group 10 in FIG. 1. FIG. 2 shows a partial arrangement of the driver group 10 in FIG. 1.

This embodiment provides a display panel 100. The display panel 100 comprises a display area AA and a driver area BB arranged on a side of the display area AA. The display panel 100 comprises at least one driver group 10 arranged on the driver area BB. Each driver group 10 corresponds to one flip-chip film 200. The driver group 10 comprises a plurality of gate driver circuit arrangement groups 12 and a plurality of data line arrangement groups 13. In one driver group 10, the gate driver circuit arrangement groups 12 and the data line arrangement groups 13 are alternately arranged. A number of GOA units 121 included in each gate driver circuit arrangement group 12 is greater than 0 and less than or equal to 2. A number of data lines 21 included in each data line arrangement group 13 is greater than 0 and less than or equal to 3. A difference in the number of the data lines 21 of any two data line arrangement groups 13 is less than or equal to 1.

Specifically, as shown in FIG. 1, the display panel 100 comprises the display area AA and the driver area BB, and the driver area BB is provided with the gate driver circuit arrangement groups 12 and the data line arrangement groups 13 that are alternately arranged. That is, the GOA units 121 (gate driver circuit units) are arranged on a same side of a border as a source driver circuit (GOA in source), which can realize extremely narrow borders on three sides other than one frame close to the driver area BB, so that the display panel 100 may be a display panel used for splicing.

Specifically, the display panel 100 comprises at least one driver group 10. When the display panel 100 is not bound with the flip-chip film 200, each driver group 10 corresponds to one flip-chip film 200. When the display panel 100 is bound with the flip-chip film 200, each driver group 10 is electrically connected to one flip-chip film 200.

Specifically, in one driver group 10, the gate driver circuit arrangement groups 12 and the data line arrangement groups 13 are arranged alternately, the number of the GOA units 121 included in each gate driver circuit arrangement group 12 is greater than 0 and less than or equal to 2, the number of the data lines 21 included in each data line arrangement group 13 is greater than 0 and less than or equal to 3, and the difference in the number of the data lines 21 of any two data line arrangement groups 13 is less than or equal to 1, so that the data lines 21 and the GOA units 121 in the driver group 10 can be arranged evenly or as evenly as possible.

In this embodiment, the data lines 21 and the GOA units 121 are evenly arranged. Even if the number of the data lines 21 is not an integer multiple of the number of the GOA units 121, the data lines 21 and the GOA units 121 are arranged as evenly as possible, so that a coupling capacitance between the data lines 21 and the GOA units 121 is as uniform as possible, and thus capacitance loads of the data lines 21 are as close to each other as possible, thereby preventing the display panel 100 from display unevenness.

In some embodiments, in one driver group 10, the number of the data lines 21 included in each data line arrangement groups 13 is greater than 1 and is less than or equal to 3, or in one driver group 10, the number of the data lines 21 included in each data line arrangement group 13 is greater than 0 and less than or equal to 2. These two arrangements can make the data lines 21 and the GOA units 121 arranged evenly or as evenly as possible.

In some embodiments, in one driver group 10, the gate driver circuit arrangement groups 12 comprising different numbers of the GOA units 121 are evenly arranged, and the data line arrangement groups 13 comprising different numbers of the data lines 21 are evenly arranged, so that the coupling capacitance between the data lines 21 and the GOA units 121 is as uniform as possible, and thus the capacitance loads of the data lines 21 are as close to each other as possible, thereby preventing the display panel 100 from display unevenness.

In some embodiments, the driver group 10 comprises a plurality of driver repeat units 11. In each driver repetitive unit, a ratio of the number of the data lines 21 and the number of the GOA units 121 is any one of 8:3, 16:9, and 4:3.

Specifically, in a 4K product (resolution is 3840*2160), when each flip-chip film 200 corresponds to or is electrically connected to 960 data lines, the display panel 100 is provided with or corresponds to 12 flip-chip films 200. In one driver group 10, a ratio of the number of the data lines 21 and the number of the GOA units 121 is any one of 8:3, 16:9, and 4:3, so that in each driver repetitive unit, the ratio of the number of the data lines 21 and the number of the GOA units 121 is any one of 8:3, 16:9, and 4:3.

Specifically, in an 8K product (resolution is 7680*4320), when each flip-chip film 200 corresponds to or is electrically connected to 960 data lines, the display panel 100 is provided with or corresponds to 24 flip-chip films 200. In one driver group 10, the ratio of the number of the data lines 21 and the number of the GOA units 121 is any one of 8:3, 16:9, and 4:3, so that in each driver repetitive unit, the ratio of the number of the data lines 21 and the number of the GOA units 121 is any one of 8:3, 16:9, and 4:3.

Second Embodiment

This embodiment is the same as or similar to the display panel 100 in the first embodiment. This embodiment further describes the structure of the display panel 100. The similarities will not be described again here, and only the differences will be described here.

Please refer to FIG. 1 and FIG. 2.

In some embodiments, the ratio of the number of the data lines 21 and the number of the GOA units 121 in each driver repetitive unit is 8:3. In each driver repetitive unit, the data lines 21 and the GOA units 121 are arranged in the following order: 2 data lines 21, 1 GOA unit 121, 3 data lines 21, 1 GOA unit 121, 3 data lines 21, and 1 GOA unit 121.

Specifically, when the ratio of the number of the data lines 21 and the number of the GOA units 121 in the driver repetitive unit 11 is 8:3, and the number of the data lines 21 is not an integer multiple of the number of the GOA units 121. In order to make the data lines 21 and the GOA units 121 evenly arranged as much as possible, an arrangement may be set as follows: the data lines 21 and the GOA units 121 in each driver repetitive unit 11 are arranged in the following order: 2 data lines 21, 1 GOA unit 121, 3 data lines 21, 1 GOA unit 121, 3 data lines 21, and 1 GOA unit 121.

Specifically, FIG. 2 illustrates first data lines 211 arranged adjacent to the GOA units 121 and second data lines 212 not arranged adjacent to the GOA units 121. In one driver repetitive unit 11 or one driver group 10, each first data line 211 is adjacent to one GOA unit 121, and coupling capacitances between different first data lines 211 and the GOA units 121 are same or similar. As for the second data lines 212, each second data line 212 is arranged adjacent to one first data line 211 and has short distances from the GOA units 121, so that coupling capacitances between different second data lines 212 and surrounding traces or circuits are similar or same. A difference between a coupling capacitance between the first data lines 211 and the surrounding traces or circuits and a coupling capacitance between the second data lines 212 and the surrounding traces or circuits is small, so that coupling capacitances between different data lines 21 and the surrounding traces or circuits are as uniform as possible, and thus the capacitance loads of the data lines 21 are as close to each other as possible, thereby preventing the display panel 100 from display unevenness.

In some embodiments, the display panel 100 further comprises a plurality of scan lines 22, and each scan line 22 is electrically connected to two GOA units 121. Each driver group 10 includes 960 data lines and 360 GOA units.

Specifically, FIG. 1 shows that each scan line 22 is electrically connected to two GOA units 121. That is, each scan line 22 is driven by 2 drivers, and two GOA units 121 provide control signals to one scan line 22.

Specifically, in a 4K product (resolution is 3840*2160), when each flip-chip film 200 corresponds to or is electrically connected to 960 data lines, the display panel 100 is provided with or corresponds to 12 flip-chip films 200, and each scan line 22 is electrically connected to two GOA units 121. In one driver group 10, the ratio of the number of the data lines 21 and the number of the GOA units 121 is 8:3, so that in each driver repetitive unit, the ratio of the number of the data lines 21 and the number of the GOA units 121 is 8:3.

Specifically, in an 8K product (resolution is 7680*4320), when each flip-chip film 200 corresponds to or is electrically connected to 960 data lines, the display panel 100 is provided with or corresponds to 24 flip-chip films 200, and each scan line 22 is electrically connected to two GOA units 121. In one driver group 10, the ratio of the number of the data lines 21 and the number of the GOA units 121 is 8:3, so that in each driver repetitive unit, the ratio of the number of the data lines 21 and the number of the GOA units 121 is 8:3.

Third Embodiment

This embodiment is the same as or similar to the display panel 100 in the first embodiment. This embodiment further describes the structure of the display panel 100. The similarities will not be described again here, and only the differences will be described here.

Figure 3:
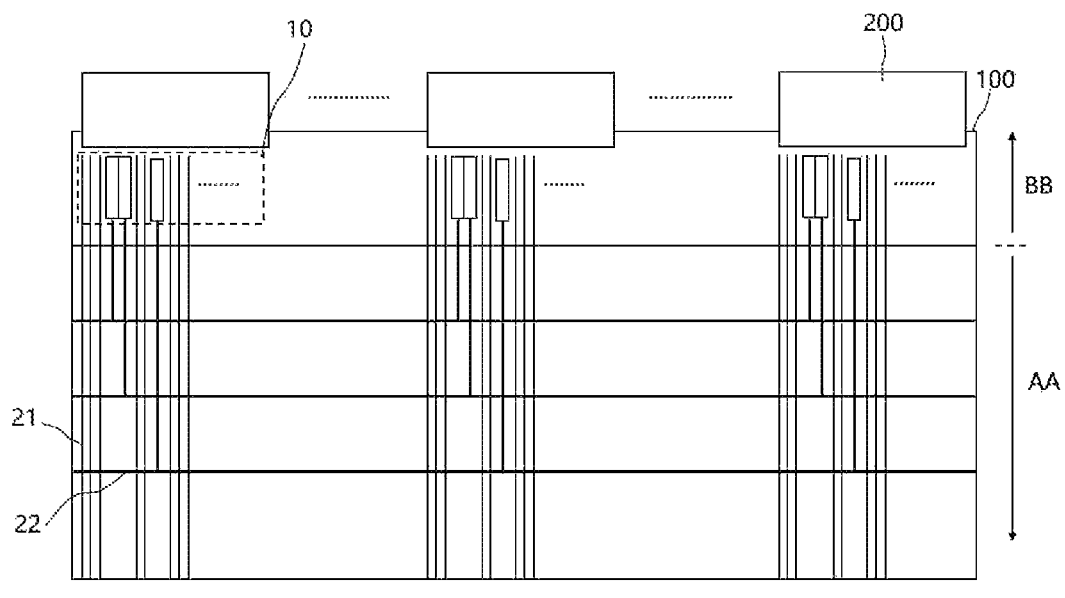
FIG. 3 is a schematic top view of a display panel according to a third embodiment of the present disclosure.
Figure 4:
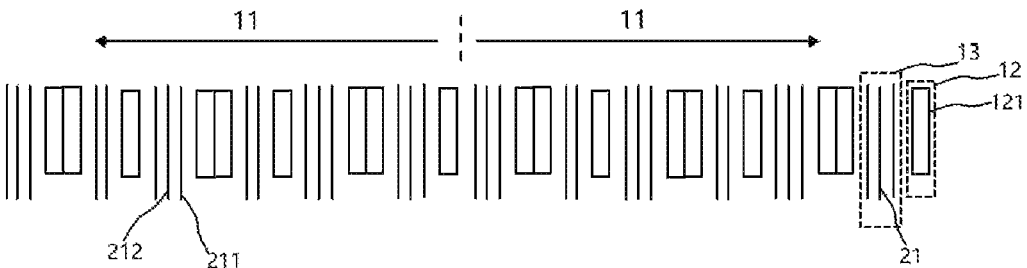
FIG. 4 is an enlarged schematic diagram of a driver group in FIG. 3.

Please refer to FIG. 3 and FIG. 4. FIG. 3 is a schematic top view of a display panel 100 provided in Embodiment Third of the present disclosure. FIG. 4 is an enlarged schematic diagram of a driver group 10 in FIG. 3. FIG. 4 shows a partial arrangement of the driver group 10 in FIG. 3.

In some embodiments, the ratio of the number of the data lines 21 and the number of the GOA units 121 in each driver repetitive unit is 16:9. In each driver repetitive unit, the data lines 21 and the GOA units 121 are arranged in the following order: 3 data lines 21, 2 GOA units 121, 2 data lines 21, 1 GOA unit 121, 3 data lines 21, 2 GOA units 121, 2 data lines 21, 1 GOA unit 121, 3 data lines 21, 2 GOA units 121, 3 data lines 21, and 1 GOA unit 121.

Specifically, when the ratio of the number of the data lines 21 and the number of the GOA units 121 in each driver repetitive unit 11 is 16:9, and the number of the data lines 21 is not an integer multiple of the number of the GOA units 121, in order to make the data lines 21 and the GOA units 121 evenly arranged as much as possible, an arrangement may be set as follows: the data lines 21 and the GOA units 121 in each driver repetitive unit 11 are arranged in the following order: 3 data lines 21, 2 GOA units 121, 2 data lines 21, 1 GOA unit 121, 3 data lines 21, 2 GOA units 121, 2 data lines 21, 1 GOA unit 121, 3 data lines 21, 2 GOA units 121, 3 data lines 21, and 1 GOA unit 121.

In some embodiments, the display panel 100 further comprises a plurality of scan lines 22, and each scan line 22 is electrically connected to three GOA units 121. Each driver group 10 includes 960 data lines 21 and 540 GOA units 121.

Specifically, FIG. 3 shows that each scan line 22 is electrically connected to three GOA units 121. That is, each scan line 22 is driven by 3 drivers, and three GOA units 121 provide control signals to one scan line 22.

Specifically, in a 4K product (resolution is 3840*2160), when each flip-chip film 200 corresponds to or is electrically connected to 960 data lines, the display panel 100 is provided with or corresponds to 12 flip-chip films 200, and each scan line 22 is electrically connected to three GOA units 121. In one driver group 10, the ratio of the number of the data lines 21 and the number of the GOA units 121 is 16:9, so that in each driver repetitive unit, the ratio of the number of the data lines 21 and the number of the GOA units 121 is 16:9.

Specifically, in an 8K product (resolution is 7680*4320), when each flip-chip film 200 corresponds to or is electrically connected to 960 data lines, the display panel 100 is provided with or corresponds to 24 flip-chip films 200, and each scan line 22 is electrically connected to three GOA units 121. In one driver group 10, the ratio of the number of the data lines 21 and the number of the GOA units 121 is 16:9, so that in each driver repetitive unit, the ratio of the number of the data lines 21 and the number of the GOA units 121 is 16:9.

This embodiment has same beneficial effects as the above embodiments, and will not be described in details herein.

Fourth Embodiment

This embodiment is the same as or similar to the display panel 100 in the first embodiment. This embodiment further describes the structure of the display panel 100. The similarities will not be described again here, and only the differences will be described here.

Figures 5, 6:
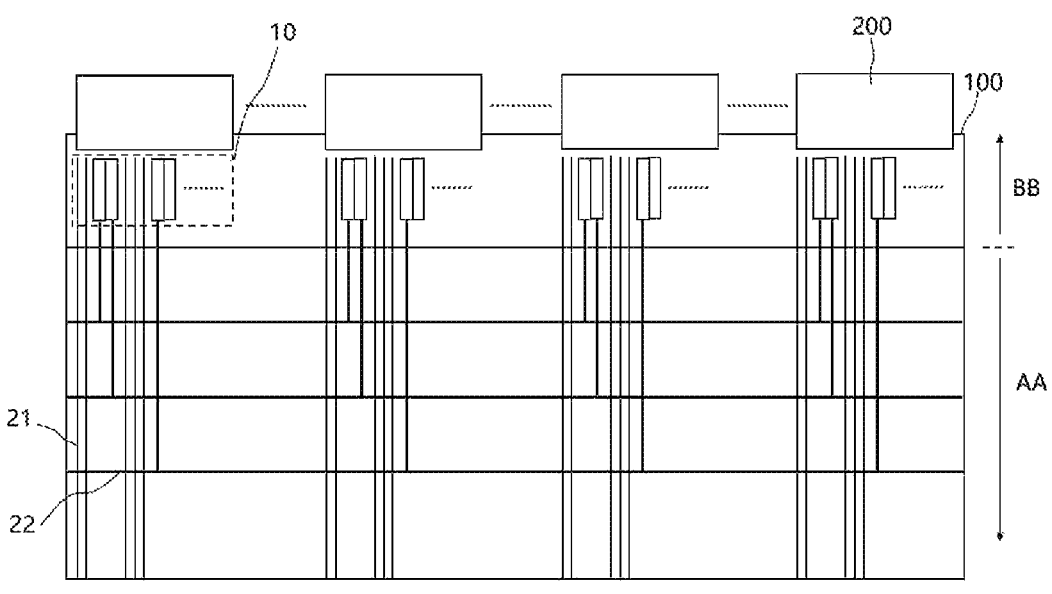
FIG. 5 is a schematic top view of a display panel according to a fourth embodiment of the present disclosure.
FIG. 6 is an enlarged schematic diagram of a driver group in FIG. 5.

Please refer to FIG. 5 and FIG. 6. FIG. 5 is a schematic top view of a display panel 100 provided in Fourth Embodiment of the present disclosure. FIG. 6 is an enlarged schematic diagram of a driver group 10 in FIG. 5. FIG. 6 shows a partial arrangement of the driver group 10 in FIG. 5.

In some embodiments, the ratio of the number of the data lines 21 and the number of the GOA units 121 in each driver repetitive unit is 4:3. In each driver repetitive unit, the data lines 21 and the GOA units 121 are arranged in the following order: 2 data lines 21, 2 GOA units 121, 3 data lines 21, 2 GOA units 121, 3 data lines 21, and 2 GOA units 121.

Specifically, when the ratio of the number of the data lines 21 and the number of the GOA units 121 in each driver repetitive unit 11 is 4:3, and the number of the data lines 21 is not an integer multiple of the number of the GOA units 121, in order to make the data lines 21 and the GOA units 121 evenly arranged as much as possible, an arrangement may be set as follows: the data lines 21 and the GOA units 121 in each driver repetitive unit 11 are arranged in the following order: 2 data lines 21, 2 GOA units 121, 3 data lines 21, 2 GOA units 121, 3 data lines 21, and 2 GOA units 121.

In some embodiments, the display panel 100 further comprises a plurality of scan lines 22, and each scan line 22 is electrically connected to four GOA units 121. Each driver group 10 includes 960 data lines 21 and 720 GOA units 121.

Specifically, FIG. 5 shows that each scan line 22 is electrically connected to four GOA units 121. That is, each scan line 22 is driven by 4 drivers, and four GOA units 121 provide control signals to one scan line 22.

Specifically, in a 4K product (resolution is 3840*2160), when each flip-chip film 200 corresponds to or is electrically connected to 960 data lines, the display panel 100 is provided with or corresponds to 12 flip-chip films 200, and each scan line 22 is electrically connected to four GOA units 121. In one driver group 10, the ratio of the number of the data lines 21 and the number of the GOA units 121 is 4:3, so that in each driver repetitive unit, the ratio of the number of the data lines 21 and the number of the GOA units 121 is 4:3.

Specifically, in an 8K product (resolution is 7680*4320), when each flip-chip film 200 corresponds to or is electrically connected to 960 data lines, the display panel 100 is provided with or corresponds to 24 flip-chip films 200, and each scan line 22 is electrically connected to four GOA units 121. In one driver group 10, the ratio of the number of the data lines 21 and the number of the GOA units 121 is 4:3, so that in each driver repetitive unit, the ratio of the number of the data lines 21 and the number of the GOA units 121 is 4:3.

This embodiment has same beneficial effects as the above embodiments, and will not be described in details herein.

The display panel provided by the embodiments of the present disclosure is described in detail above. The present disclosure uses specific examples to describe principles and embodiments of the present disclosure. The above description of the embodiments is only for helping to understand solutions of the present disclosure and their core ideas.

Furthermore, those skilled in the art may make modifications to the specific embodiments and applications according to ideas of the present disclosure. In conclusion, the present specification should not be construed as a limitation to the present disclosure.

What is claimed is:

1. A display panel, comprising a display area and a driver area arranged on a side of the display area, and further comprising at least one driver group arranged in the driver area, wherein each driver group corresponds to one flip-chip film, and each driver group comprises a plurality of gate driver circuit arrangement groups and a plurality of data line arrangement groups;

wherein in one driver group, the gate driver circuit arrangement groups and the data line arrangement groups are alternately arranged, a number of GOA units included in each gate driver circuit arrangement group is less than or equal to 2, a number of data lines included in each data line arrangement group is less than or equal to 3, and a difference in the number of the data lines of any two data line arrangement groups is less than or equal to 1.

2. The display panel according to claim 1, wherein in one driver group, the number of data lines included in each data line arrangement group is greater than 1 and less than or equal to 3.

3. The display panel according to claim 1, wherein in one driver group, the number of data lines included in each data line arrangement group is greater than 0 and less than or equal to 2.

4. The display panel according to claim 1, wherein in one driver group, the gate driver circuit arrangement groups comprising different numbers of the GOA units are evenly arranged.

5. The display panel according to claim 4, wherein in one driver group, the data line arrangement groups comprising different numbers of the data lines are evenly arranged.

6. The display panel according to claim 1, wherein in one driver group, the data line arrangement groups comprising different numbers of the data lines are evenly arranged.

7. The display panel according to claim 4, wherein the driver group comprises a plurality of driver repetitive units, and in each driver repetitive unit, a ratio of the number of the data lines to the number of the GOA units is any one of 8:3, 16:9, and 4:3.

8. The display panel according to claim 1, wherein each flip-chip film corresponds to or is electrically connected to 960 data lines.

9. The display panel according to claim 8, wherein resolution of the display panel is 3840*2160, and the display panel corresponds to 12 flip-chip films.

10. The display panel according to claim 8, wherein resolution of the display panel is 7680*4320, and the display panel corresponds to 24 flip-chip films.

11. The display panel according to claim 7, wherein the ratio of the number of the data lines and the number of the GOA units in each driver repetitive unit is 8:3; and in each driver repetitive unit, the data lines and the GOA units are arranged in the following order: 2 data lines, 1 GOA unit, 3 data lines, 1 GOA unit, 3 data lines, and 1 GOA unit.

12. The display panel according to claim 11, further comprising a plurality of scan lines, wherein each scan line is electrically connected to two GOA units, and each driver group includes 960 data lines and 360 GOA units.

13. The display panel according to claim 7, wherein the ratio of the number of the data lines and the number of the GOA units in each driver repetitive unit is 16:9; and in each driver repetitive unit, the data lines and the GOA units are arranged in the following order: 3 data lines, 2 GOA units, 2 data lines, 1 GOA unit, 3 data lines, 2 GOA units, 2 data lines, 1 GOA unit, 3 data lines, 2 GOA units, 3 data lines, and 1 GOA unit.

14. The display panel according to claim 13, further comprising a plurality of scan lines, wherein each scan line is electrically connected to two GOA units, and each driver group includes 960 data lines and 360 GOA units.

15. The display panel according to claim 7, wherein the ratio of the number of the data lines and the number of the GOA units in each driver repetitive unit is 4:3; and, in each driver repetitive unit, the data lines and the GOA units are arranged in the following order: 2 data lines, 2 GOA units, 3 data lines, 2 GOA units, 3 data lines, and 2 GOA units.

16. The display panel according to claim 15, further comprising a plurality of scan lines, wherein each scan line is electrically connected to two GOA units, and each driver group includes 960 data lines and 720 GOA units.

17. A display panel, comprising:

a plurality of flip-chip films, disposed on a driver area that is located on only one edge of the display panel;

a plurality of driver groups, disposed on the driver area, each of the plurality of driver groups connected to one of the plurality of flip-chip films, and each of the plurality of driver groups comprising a plurality of gate driver circuit arrangement groups and a plurality of data line arrangement groups;

wherein the gate driver circuit arrangement groups and the data line arrangement groups are alternately arranged, a number of GOA units included in each gate driver circuit arrangement group is less than or equal to 2, a number of data lines included in each data line arrangement group is less than or equal to 3, and a difference in the number of the data lines of any two data line arrangement groups is less than or equal to 1.

18. The display panel according to claim 17, wherein in one driver group, the gate driver circuit arrangement groups comprising different numbers of the GOA units are evenly arranged.

19. The display panel according to claim 18, wherein in one driver group, the data line arrangement groups comprising different numbers of the data lines are evenly arranged.

20. The display panel according to claim 18, wherein the driver group comprises a plurality of driver repetitive units, and in each driver repetitive unit, a ratio of the number of the data lines to the number of the GOA units is any one of 8:3, 16:9, and 4:3.

* * * * *